Feb. 17, 1970 S. J. TOMSA 3,496,383
PEAK DETECTOR-AMPLIFIER
Filed May 26, 1966
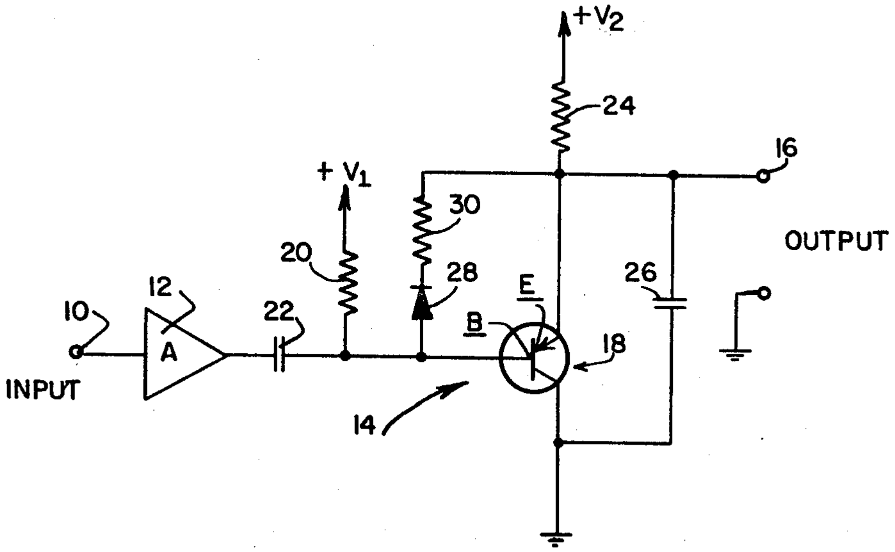
INVENTOR
STANLEY J. TOMSA
BY Mueller, Aichele & Rauner
ATTYS.

3,496,383
Patented Feb. 17, 1970

3,496,383
PEAK DETECTOR-AMPLIFIER

Stanley J. Tomsa, Berwyn, Ill., assignor to Motorola, Inc., Franklin Park, Ill., a corporation of Illinois Filed May 26, 1966, Ser. No. 553,089
Int. Cl. H03k 5/20
U.S. Cl. 307—235 2 Claims

ABSTRACT OF THE DISCLOSURE

A voltage peak-to-peak detector uses a transistor in an emitter follower configuration to charge a capacitor. A diode is connected between the emitter and base of the transistor with its polarity reversed from the polarity of the transistor. This configuration permits current flow during the entire period of the input signal and provides DC gain within the detector stage.

Voltage peak-to-peak detectors had been found useful in many applications, such as in squelch control circuits used in communication receivers for eliminating background noise from the received signal. Such detectors provide a DC voltage which is in proportion to the received signal. In many cases it is necessary to increase the resulting DC voltage to bring the same to the level required. For example, communication receivers using prior art peak-to-peak detectors require DC amplifiers and a cathode or emitter follower for amplifying the detected peak-to-peak voltage. This invention eliminates the need for such additional amplifiers.

Therefore, it is an object of this invention to provide an improved peak-to-peak detector.

It is another object of this invention to provide a peak-to-peak detector providing voltage gain within the detector stage while maintaining low output impedance.

It is a further object of this invention to provide a peak-to-peak detector-amplifier utilizing a minimum number of components; and It is still another object of this invention to provide a stable peak-to-peak detector having amplifier properties.

A detector-amplifier constructed according to the teachings of this invention includes a semiconductor device, such as a transistor, arranged in a grounded-collector configuration and together with other components forms a peak-to-peak detector. A positive feedback circuit is connected between the base and emitter electrodes of the transistor such that the base signal voltage will tend to follow the emitter signal voltage. This feedback enables the circuit to have voltage gain. During the quiescent period when the transistor is not conducting, the feedback circuit will be cut off such that the emitter and base voltages are independent of each other. Such a feedback circuit may consist of a semiconductor diode in series circuit with a resistance.

Referring now to the accompanying figure, there is shown an exemplary embodiment of this invention utilizing an NPN transistor.

A signal envelope (not shown) having peak voltages to be detected is applied to input terminal 10 of amplifier 12. The amplified envelope signal is applied to the peak-to-peak detector-amplifier generally denoted by numeral 14. The detector 14 detects the peak-voltage magnitudes, amplifies the magnitude and then supplies the amplified signal to the output terminal 16 as a steady-state DC voltage for use in a conventional squelch circuit.

Transistor 18 is normally in its current cutoff state. Supply voltage $V_1$ supplies current through base bias resistor 20 driving transistor 18 into its current cutoff state by making the base B voltage positive with respect to emitter E voltage. During transistor 18 cutoff, supply voltage $V_2$ appears on output terminal 16 and capacitor 26 is charged to voltage $V_2$. Resistor 24 is the emitter follower resistance.

The amplifier 12 supplies input signals, such as an envelope wave, through capacitor 22 to the base B. The negative peak voltages of this signal make the base B voltage negative with respect to the emitter E voltage driving transistor 18 into its current conducting state. The positive peak voltages drive transistor 18 further into current cutoff.

Transistor 18 conducting causes a current flow through resistor 24 tending to make the voltage on output terminal 16 more negative. Simultaneously, capacitor 26 discharges its voltage through the transistor 18 dropping terminal 16 voltage until the output voltage is an indication of the amplifier 12 input peak voltages. This balanced circuit condition is determined by the conductivity of transistor 18 and resistor 24. The capacitor 26 stores the detected peak voltages between successive peaks of the applied waveform.

The above-described configuration provides an output voltage magnitude which is no more than the amplifier 12 supplied voltage magnitude. To provide voltage signal amplification in this peak detector circuit a feedback means such as diode 28 is connected between the base B and the emitter E for providing positive feedback within the circuit. Positive peak voltages of the input signal are now clamped to the voltage at the emitter E of transistor 18 to prevent driving transistor 18 into current cutoff. This clamping assures that part of the input voltage wave will drive the base B of the transistor negative with respect to the emitter E regardless of the voltage at E. The clamping makes the bias from B to E independent of DC levels on E. Therefore, transistor 18 can still be driven into conduction even after the voltage at point 16 has changed by more than the peak-to-peak voltage of the input waveform supplied by amplifier 12.

For making the input impedance of detector 14 to amplifier 12 the same during reception of positive or negative peak voltages, a resistor 30 may be added in series circuit relation to diode 28. During reception of positive peaks diode 28 is conducting while transistor 18 is not. During reception of negative peak voltages transistor 18 is drawing input current while diode 28 is non-conducting. Capacitor 22 is thus provided with a current path for both positive and negative voltage peaks, one through diode 28 and the other through transistor 18.

What is claimed is:

1. A single-stage peak-to-peak detector-amplifier for operation with a signal envelope including peak voltages, including the combination of:
   - direct current potential supply means,
   - a semiconductor device having collector, base and emitter electrodes,
   - means connecting the collector and emitter electrodes in series with said direct current potential supply means and including emitter-follower impedance means connected to the emitter electrode,
   - base bias resistor means connecting the base electrode to said direct current potentiial supply means to apply a bias potential to said base electrode which tends to hold said semiconductor device non-conducting,
   - a capacitance electrically shunted across the emitter and collector electrodes,
   - input alternating current coupling means connected to the base electrode for applying thereto a signal envelope including peak voltages to be detected, with the applied signal envelope overcoming the bias potential to cause said semiconductor device to conduct, and feedback means connected between the base and emitter electrodes said feedback means including a diode disposed across said base and emitter electrode and polarized opposite to the polarization of the base-to-emitter electrodes for clamping the base voltage to the emitter voltage during the entire period of said signal envelope, whereby the emitter voltage is amplified with respect to said input peak voltages.

2. The combination of claim 1 and further including a resistor in series circuit with said diode.

References Cited

UNITED STATES PATENTS

| | | | |
|---|---|---|---|
| 3,064,145 | 11/1962 | Heckleman | 307—235 |
| 3,073,968 | 1/1963 | Tribby | 307—235 |
| 3,280,342 | 10/1966 | Ashley. | |
| 3,060,331 | 10/1962 | Habisohn | 307—235 |
| 3,293,451 | 12/1966 | Henning et al. | 307—235 |

DONALD D. FORRER, Primary Examiner

B. P. DAVIS, Assistant Examiner

U.S. Cl. X.R.

307—237; 328—150; 330—26, 32